United States Patent [19]

Douglas

[11] Patent Number: 4,807,016
[45] Date of Patent: Feb. 21, 1989

[54] DRY ETCH OF PHOSPHOSILICATE GLASS WITH SELECTIVITY TO UNDOPED OXIDE

[75] Inventor: Monte A. Douglas, Coppell, Tex.

[73] Assignee: Texas Instruments Incorporated, Dallas, Tex.

[21] Appl. No.: 123,099

[22] Filed: Nov. 20, 1987

Related U.S. Application Data

[63] Continuation-in-part of Ser. No. 755,140, Jul. 15, 1985, Pat. No. 4,711,698.

[51] Int. Cl.[4] ............... B44C 1/22; C03C 15/00; C03C 25/06; C23F 1/02
[52] U.S. Cl. ............... 357/67; 156/643; 156/644; 156/646; 156/651; 156/653; 156/657; 156/659.1; 156/663; 204/192.37; 252/79.1; 357/71; 434/228; 434/240; 434/192
[58] Field of Search ............... 156/628, 643, 644, 646, 156/651, 653, 657, 659.1, 662, 663, 345; 252/79.1; 204/192.37, 298; 437/29, 40, 41, 59, 187, 192, 194, 203, 228, 235, 240; 357/23.1, 40, 41, 67, 71

[56] References Cited

U.S. PATENT DOCUMENTS

| | | | |
|---|---|---|---|
| 3,700,508 | 10/1972 | Keen | 156/656 X |
| 4,420,503 | 12/1983 | Leung et al. | 156/663 X |
| 4,535,528 | 8/1985 | Chen et al. | 437/240 X |
| 4,634,494 | 1/1987 | Taji et al. | 156/653 X |
| 4,654,112 | 3/1987 | Douglas et al. | 156/663 X |

*Primary Examiner*—William A. Powell
*Attorney, Agent, or Firm*—Rodney M. Anderson; Leo N. Heiting; Melvin Sharp

[57] ABSTRACT

An etchant of PSG (14) or BPSG with high selectivity to substantially undoped oxide (12) includes a fluorine-liberating compound and a fluorine-scavenging compound. The fluorine-liberating compound is preferably a perfluorinated inorganic compound, and the fluorine-scavenging compound is preferably a hydrogen-liberating compound such as hydrogen. A particularly preferred inorganic fluorine-liberating compound is nitrogen trifluoride. In an exemplary embodiment, etch rate ratios of PSG to undoped oxide as high as 11 to 1 were obtained.

26 Claims, 1 Drawing Sheet

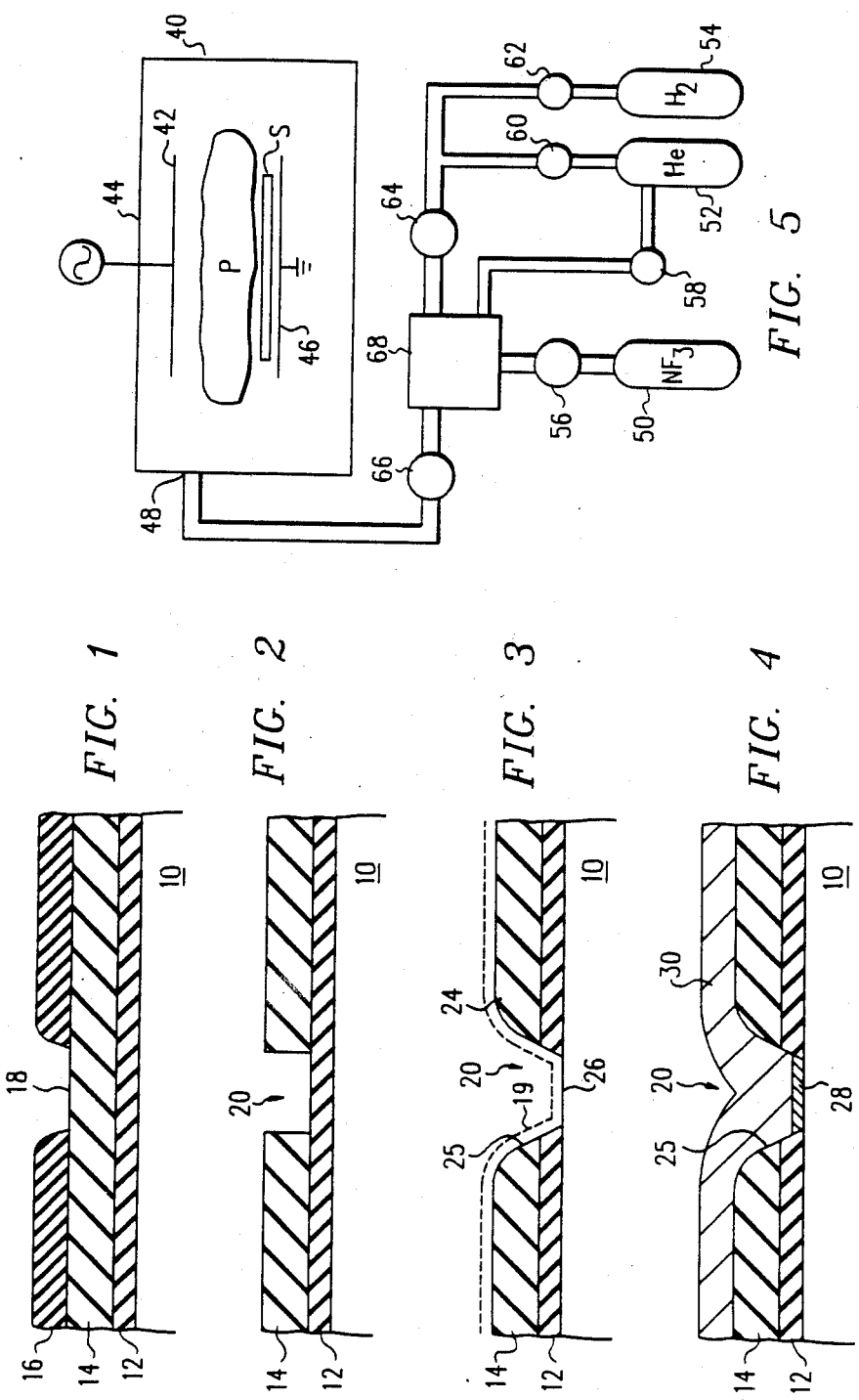

DRY ETCH OF PHOSPHOSILICATE GLASS WITH SELECTIVITY TO UNDOPED OXIDE

RELATED APPLICATION

This application is a continuation-in-part of application Ser. No. 755,140, filed Jul. 15, 1985, now U.S. Pat. No. 4,711,698.

TECHNICAL FIELD OF THE INVENTION

This invention relates in general to the integrated circuit etching art, and more particularly to a method for etching phosphosilicate glass (PSG) with selectivity to undoped oxide.

BACKGROUND OF THE INVENTION

It is desirable to use phosphosilicate glass (PSG) and borophosphosilicate glass (BPSG) as dielectric layers in the fabrication of integrated circuits. PSG and BPSG have certain advantages over conventional, relatively undoped oxide dielectric layers. For example, their relatively low melting points (approximately 850° to 1200° C.) allows them to be reflowed after deposition to planarize a surface or slope the sidewalls of any contact or via opened in them. This is particularly advantageous for metal interconnects, as a via or contact with sloped sidewalls results in good conformal metal depositions therein and avoids metal electromigration problems. The low temperatures at which these reflows occur allows the reflow step to take place even after the implantation of semiconductor dopant species, as the temperature is not high enough to permit substantial diffusion of these dopants into surrounding areas of the semiconductor.

Another advantage of PSG and BPSG is their ability to scavenge group IA metals such as sodium and potassium. For this reason, it is often used as a passivating barrier.

PSG and BPSG are glasses that typically include approximately 1 to 10% by weight of phosphorus in their chemical formula. The boron in BPSG may constitute up to 5% boron by weight of this glass. The impurities in PSG and BPSG, particularly phosphorus, have a tendency to diffuse into adjoining semiconductor substrates after the application of elevated temperature. Thus, the reflow of PSG cannot be done where the reflowed layer immediately adjoins a semiconductor layer such as silicon without the danger of counterdoping the semiconductor with phosphorus. This problem is conventionally solved by placing a diffusion barrier such as a thin oxide (approximately 1000 Angstroms thick) in between the PSG and the underlying structure.

The necessity of interposing an undoped oxide diffusion barrier layer between the PSG and the underlying integrated circuit structure presents the additional problem of finding an etchant that will selectively etch PSG with high selectivity to the oxide. Without this high selectivity, there is a danger that the undoped oxide diffusion barrier would be compromised.

Various processes are known in the art for etching oxide with high selectivity to silicon. One such chemistry is described in my copending application Ser. No. 755,140, filed Jul. 15, 1985 (Attorney's Docket No. TI-10883). Other examples can be found in Heinecke, 18 *Solid State Electronics* 1146 (1975); Heinecke, 21 *Solid State Technology* 104 (1978) and Winters, 49 J. Appld. Phys. 5165 (1978). However, the last three disclosures concern fluorocarbon-based chemistries that introduce the problem of carbon polymerization on the surface. None of the literature discloses or suggests an etchant for etching PSG with high selectivity to oxide, or a PSG etchant that avoids carbon polymerization by the incorporation of an inorganic center. Hence, a need has arisen in the industry for such an etchant.

SUMMARY OF THE INVENTION

The present invention provides an etchant for etching phosphosilicate glass, borophosphosilicate glass or other silicate glass having a substantial phosphorus impurity with high selectivity to substantially undoped silicon oxide. The plasma etchant is capable of obtaining a PSG/silicon dioxide etch ratio of at least 6 to 1, and more preferably up to 11 to 1.

Preferably, the plasma utilizes a gas comprised of a fluorine scavenger liberating compound and a fluorine-liberating compound. Preferred fluorine scavenger liberating species include compounds capable of liberating hydrogen, such as $H_2$, $NH_3$, $B_2H_6$, $PH_3$, $CH_4$, $SiH_4$, $H_2CO$, $H_2O$ and mixtures thereof. Other fluorine scavenger compounds include $(CN)_2$, $CO$ and $NO$. Preferred fluorine-liberating compounds comprise inorganic perfluorinated compounds such as $NF_3$, $SiF_4$, $SF_6$, $SF_4$ and $BF_3$. Depending on the tendency of the fluorine- and hydrogen- bearing constituents to dissociate, the ratio of atomic fluorine to atomic hydrogen in the gas may vary from 3:1 to 25:1.

A principal advantage of the invention is the provision of an etchant that can etch PSG or BPSG with a high selectivity to substantially undoped silicon dioxide. This in turn allows for the first time a reliable end-point etch process whereby a top layer of PSG or BPSG may be etched down to a layer of oxide. The PSG layer can then be reflowed to provide sloped sidewalls of the orifice created in the PSG. Then, the PSG and the oxide can be simultaneously back-etched to open the orifice to the underlaying structure, such as a semiconductor substrate.

BRIEF DESCRIPTION OF THE DRAWINGS

Other aspects of the invention and their advantages may be appreciated with reference to the following detailed description taken in conjunction with the appended drawings in which:

FIGS. 1-4 are successive schematic highly magnified sectional views of an integrated circuit structure, showing successive steps in the fabrication of a via according to the invention; and FIG. 5 is a schematic diagram of an etching apparatus according to the invention.

DETAILED DESCRIPTION

In exemplary embodiments of the invention herein described, a study is described that focuses on the etching behavior of nitrogen trifluoride ($NF_3$) and elemental hydrogen as entrained into a helium gas flow. This gas was introduced into a plasma reactor (described in conjunction with FIG. 5) in which was mounted a silicon slice having an undoped oxide layer grown thereon. A layer of PSG was deposited on the undoped oxide.

The etch rate ratio of PSG to undoped oxide was studied as a function of the percentage hydrogen content. As the percentage of hydrogen rises in the reactor, the hydrogen scavenges free fluorine, making the plasma more fluorine deficient. The effects of varying the reaction pressure inside the reactor were also observed.

The reactor employed was a parallel-plate, plasma-mode etcher, having a graphite powered electrode and a grounded wafer substrate. The electrode spacing was kept constant at one centimeter. The total gas flow was held at 200 standard cubic centimeters per minute (sccm). The substrate temperature was maintained at 5° C. and the RF power was held at 150 watts, or about 2 watts/cm$^2$ of slice area. The phosphorus content of the PSG by weight was 10%.

The following Table I is a tabulation of the $NF_3$, $H_2$ and He flows, reactor pressures and the resultant PSG and oxide etch rates.

| (sccm) $NF_3$ Flow | (sccm) $H_2$ Flow | (sccm) He Flow | (Å/min) PSG ER | (Å/min) ox ER | PSG/ox ERR | (torr) Press |
|---|---|---|---|---|---|---|
| 50 | 30 | 120 | 5535 | 1962 | 2.8 | 1.0 |
| 50 | 30 | 120 | 4430 | 697 | 6.3 | 2.0 |
| 50 | 30 | 120 | 666 | 552 | 1.2 | 3.0 |
| 50 | 75 | 75 | 11479 | 1049 | 10.9 | 2.0 |
| 50 | 150 | 0 | 5368 | 908 | 5.9 | 2.0 |

The $H_2$ flows listed are actually flows of helium into which 10% hydrogen was entrained.

The above Table shows that there is an optimal percentage hydrogen for a given pressure of operation in relative degree of $NF_3$ flow. For a flow rate of entrained hydrogen of 30 sccm, a pressure of 2.0 torr provided the best PSG: oxide etch ratio. At 2.0 torr, an optimal etch rate ratio was achieved for a hydrogen flow of 75 sccm. The etch rate ratio was degraded for a flow of 150 sccm of $H_2$ suggesting that hydrogen was substantially decreasing the availability of PSG etchants.

The obtained etch rate ratios were for 10% PSG as opposed to undoped thermal oxide. Good selectivity should also be obtained for slightly doped oxide layers. It is expected that the etch rate ratio will vary linearly with the degree of phosphorus concentration in the oxide. Typical PSG layers used in conventional semiconductor processes have a range of from 3 to 10% by weight of phosphorus in their compositions.

In general, an etch of PSG, or other silicate glass with a substantial phosphorus impurity, with selectivity to relatively undoped oxide should be obtained from any plasma etchant that contains both a major portion of a fluorine-liberating gas and a minor portion of a fluorine scavenger liberating species. The fluorine scavenger liberating species can also comprise consumable electrodes, as can be fabricated out of graphite or silicon. The fluorine scavenger liberating species as embodied as a gas constituent can be a hydrogen-liberating gas, such as hydrogen, ammonia, diborane, phosphine, ethane, silane, $H_2CO$, $H_2O$ and mixtures thereof. If ethane or a similar organic molecule (such as formaldehyde) is chosen as the hydrogen-liberating constituent, there should be no trouble with polymerization on the substrate, as the concentrations effective for the proper scavenging of fluorine atoms are generally less than 5% by weight of carbon with respect to the gas etchant mixture.

The other constituent is preferably a perfluorinated inorganic compound, although incompletely fluorinated inorganic compounds can also be used. It is also possible to have one gas constituent that liberates both hydrogen and fluorine. Preferred inorganic perfluorinated compounds include $NF_3$, $SF_6$, $SF_4$, $SiF_4$ and $BF_3$ with $NF_3$ and $SF_6$ being particularly preferred. As using $NF_3$ and $H_2$ as the reacting gas constituents, the atomic ratio of fluorine to hydrogen in the etchant mixture is preferred to fall in the range of about 5:1 to 25:1, with a particularly preferred ratio being about 10:1. If $SF_6$ is used as the fluorine liberating agent, the fluorine to hydrogen ratio should be somewhat less, and should be selected from the range of about 3:1 to about 17:1, as sulphur hexafluoride has a tendency to dissociate its fluorine atoms more readily than nitrogen trifluoride.

Helium is a preferred entrainment gas, as it is more inert than the other noble gases that could also be used with the invention. The use of a large entraining amount of helium also increases the safety of handling the gas reaction constituents and helps to stabilize the plasma.

The pressure inside the reactor should be maintained above 0.01 torr to 10 torr. A particular preferred reaction pressure is about 2 torr. The reaction temperature should be within the range of 0° to 150° C. The applied RF power per square centimeter of reaction surface should fall within the range of 0.1 to 10 watts/cm$^2$. In terms of volume of the reactor, the applied power should range from $1 \times 10^{-4}$ to $1 \times 10^{-2}$ watts/cm$^3$. It is preferred that the inorganic central atoms of the fluorine-liberating constituent comprise from 5 to 50% of the partial pressure of the entire mixture.

Turning now to FIGS. 1-4, an exemplary fabrication process according to the invention is illustrated, showing the forming of a metal contact to a semiconductor surface through layers of PSG and oxide. Referring first to FIG. 1, a semiconductor substrate 10, such as silicon, is provided. More complex structure can be substituted for substrate 10, such as a polysilicon emitter contact for a partially fabricated bipolar transistor (not shown). On top of layer 10, a diffusion barrier layer 12 of oxide is formed, preferably by a thermal method. It is preferred that oxide layer 12 be approximately 1000 Angstroms thick in order to exhibit resistance against the diffusion of phosphorus into semiconductor substrate 10.

Next, a layer 14 of phosphosilicate glass is deposited over oxide 12. Layer 14 can also be borophosphosilicate glass, or other phosphosilicate glasses having other minor impurities. A layer 16 of photoresist is then deposited and patterned over PSG layer 14. Photoresist 16 is patterned to expose an area 18 of the phosphosilicate glass layer 14.

Turning now to FIG. 2, an etch of layer 14 is now performed. This is preferably done by means of a plasma etch using a gas etchant mixture according to the invention as above described and that etches PSG with a high selectivity to the underlying oxide layer 12. The photoresist layer 16 is then removed.

In FIG. 3, the structure is heated to cause the reflow of PSG layer 14 to make sloped sidewalls 19 (shown in phantom), thus improving the contact to substrate 10. Where layer 14 comprises borophosphosilicate glass (BPSG), the temperature need only be approximately around 850° C. Where layer 14 comprises PSG, the temperature is elevated to about 1050° C.

Next, a back-etch is performed that etches the PSG layer 14 and the oxide layer 12 at substantially equal rates. The dotted profile 19 of the layer 14 will then be transferred downward to surface 24, including sloped sidewalls 25. This carries the sloped sidewalls 25 of contact 20 down to the exposed surface 26 of semiconductor substrate 10.

FIG. 4 illustrates the final stages in fabrication of the contact. A refractory metal layer 28 such as titanium tungsten alloy (Ti—W) is first preferably selectively deposited, as by sputtering, into via 20. This is followed by the deposit of a conventional conductive metal interconnect layer 30, which can for example comprise aluminum or copper.

The completed structure has a PSG layer 14 that acts as a barrier to group IA impurities, and further has sidewalls 25 formed in both layers 14 and 12 for good metal conformality avoiding electromigration problems. The etch of PSG layer 14 that is selective to oxide layer 12 makes possible a retention of oxide layer 12 before the reflowing of layer 14. This prevents the spiking of phosphorus into substrate 10. As illustrated, the present invention expands the use of PSG and BPSG as an integrated circuit dielectric.

In FIG. 5, a schematic representation of an etching apparatus according to the invention is shown. A reactor vessel 40 is provided capable of maintaining internal atmosphere pressures of 0.01 to 10 torr and an internal temperature of about 0° to 150° C. An RF power electrode 42 is connected through the dielectric chamber wall 44 of vessel 42 and to an RF power source, which can for example generate 150 watts at 13.56 kilohertz. Vessel 40 further includes a ground or substrate electrode 46. For the etching step of the invention, the distance between electrode 42 and electrode 46 should be maintained in a range of 0.1 to 5 inches, preferably about one-half inch. A plasma P is formed in between electrodes 42 and 46 and in contact with slice S on which a phosphosilicate glass layer has been deposited.

An outlet 48 to vessel 44 introduces the gas etchant into chamber 40. In the preferred embodiment, the gas etchant comprises nitrogen trifluoride from a source 50, helium from a source 52 and hydrogen from a source 54. Valves 56, 58, 60, 62, 64 and 66 are operated to control the relative flows of the gases from sources 50-54.

Hydrogen from source 54 is entrained with a much larger amount of helium from source 52 and is fed through valve 64 to a mixing chamber 68. A separate amount of helium is released through valve 58 into chamber 68. Mixing chamber 68 also receives a predetermined amount of nitrogen trifluoride through valve 56. As mixed, the gas etchant proceeds through a valve 66 to the chamber 40, where is activated by radio frequency energy to produce the plasma P.

In an alternative embodiment, hydrogen source 54 is removed. The fluorine-scavenging agents are instead supplied by the composition of consumable electrodes 42 and 46, which can be fabricated of graphite or silicon.

In summary, a dry etchant gas for etching PSG with high selectivity to substantially undoped oxide has been disclosed. The etchant is capable of producing an etch rate ratio of PSG to undoped oxide of up to 11 to 1. This high selectivity allows the creation of contacts through PSG layers and a thin oxide layer to an underlying structure without phosphorus counterdoping.

While preferred embodiments and their advantages have been detailed in the above description, the invention is not limited thereto but only by the spirit and scope of the appended claims.

What is claimed is:

1. An etchant for etching a glass selected from the group consisting of phosphosilicate glass and borophosphosilicate glass with high selectivity to substantially undoped silicon dioxide, and capable of attaining a phosphosilicate glass/silicon dioxide etch rate ratio of at least six to one.

2. The etchant of claim 1, and further comprising a plasma in a gas including a fluorine-scavenging species and a fluorine-liberating compound.

3. The etchant of claim 2, wherein said gas comprises an inorganic fluorine-liberating gas and a gas selected from the group consisting of hydrogen-liberating gasses, $(CN)_2$, $CO_1$, NO and mixtures thereof.

4. The etchant of claim 3, wherein said etch rate ratio approximates 11 to 1.

5. The etchant of claim 3, wherein said fluorine-liberating gas is selected from the group consisting of $NF_3$, $SiF_4$, $SF_4$, $SF_6$, $BF_3$ and mixtures thereof.

6. The etchant of claim 3, wherein said hydrogen-liberating gas is selected from the group consisting of hydrogen, $NH_3$, $B_2H_6$, $PH_3$, $CH_4$, $SiH_4$, $H_2CO$, $H_2O$ and mixtures thereof.

7. An etchant for etching a glass having a substantial phosphorus impurity with high selectivity to substantially undoped silicon dioxide, comprising:
a plasma in a gas including a perfluorinated inorganic compound and a hydrogen-liberating compound, the molar ratio of fluorine to hydrogen in said gas selected from the range between about 3:1 and about 25:1.

8. The etchant of claim 7, wherein said gas comprises nitrogen trifluoride and hydrogen, the molar ratio of nitrogen trifluoride to hydrogen selected from the range between about 3:1 and about 17:1.

9. The etchant of claim 8, wherein the molar ratio of nitrogen trifluoride to hydrogen is in the range between 25:1 to about 1:5.

10. A method for creating an orifice through a glass to a silicon layer, the glass selected from the group consisting of phosphosilicate glass and borophosphosilicate glass, comprising the steps of:
forming a silicon dioxide layer suitable as a phosphorus diffusion barrier on a surface of the silicon layer;
forming a layer of the glass on the oxide layer;
masking the glass layer to leave an exposed area thereon;
etching the glass in the exposed area down to the oxide layer using a gas etchant having high selectivity to the oxide layer; and
etching the exposed silicon dioxide layer to form an orifice through the glass layer and the silicon dioxide layer to the silicon layer.

11. The method of claim 10, wherein said step of etching the glass in the exposed area comprises the further steps of:
creating a plasma discharge in proximity to the glass layer;
selecting a gas etchant comprising an inorganic flourine-liberating gas and a free flourine scavenger liberating gas; and
passing the gas etchant through the glow discharge.

12. The method of claim 11, wherein said step of etching the glass in the exposed area further includes the step of maintaining a pressure of the gas etchant in a range between 0.01 and 10 torr.

13. The method of claim 10, and further including the step of:
after said step of etching the glass in the exposed area, reflowing the glass layer to create sloped sidewalls in the orifice.

14. The method of claim 13, wherein said step of etching the exposed silicon dioxide layer further includes the step of back-etching the exposed silicon dioxide layer and the glass layer at about the same rate to preserve the sloped contour of the sidewalls of the orifice.

15. The method of claim 10, wherein said step of forming the phosphorus-resistant silicon dioxide layer comprises the step of growing a substantially undoped silicon dioxide layer from the silicon layer.

16. The method of claim 10, wherein said step of etching the glass in the exposed area comprises the further steps of:
provacing a plasma etch chamber having at least one electrode comprising a fluorine-scavenging species;
selecting a gas etchant including at least one free flourine-liberating gas;
introducing the gas etchant into the chamber;
generating a plasma from the gas etchant in the vicinity of the glass layer.

17. A conductor contact for an integrated circuit device, comprising:
a semiconductor layer;
a phosphorus-resistant silicon dioxide layer formed on said semiconductor layer;
a glass layer selected from the group consisting of phosphosilicate glass and borophosphosilicate glass and formed on said silicon dioxide layer;
an orifice formed at least through said glass layer, sloped sidewalls of said orifice formed by etching the glass layer to the oxide layer with selectivity to the oxide and then reflowing said glass layer; and
a conductor formed in said orifice having good conformity to said sloped sidewalls.

18. The contact of claim 17, wherein said phosphorus-resistant silicon dioxide layer comprises a gate of a device formed in said semiconductor layer thereunder, said conductor making contact to said gate.

19. The contact of claim 17, wherein said orifice is formed through said glass layer and said silicon dioxide layer such that said conductor directly contacts said semiconductor layer, continuous sloped sidewalls of said orifice formed through said glass layer and said silicon dioxide layer by back-etching said glass layer and said silicon dioxide layer after reflowing said glass layer.

20. A process for etching a glass comprising a major portion of silica and a minor proportion of phosphorus oxide, and having with high selectivity to substantially undoped silicon dioxide, comprising the step of exposing a structure comprising the glass and the silicon dioxide to a plasma in a gas comprising:
a minor portion of a compound selected from the group consisting of hydrogen-liberating compounds, $(CN)_2$, CO and NO; and
a major portion of a perfluorinated inorganic gas compound.

21. The process of claim 20, and further including the step of selecting the hydrogen-liberating compound from a group consisting of hydrogen, $NH_3$, $B_2H_6$, $PH_3$, $CH_4$, $SiH_4$, $H_2CO$, $H_2O$ and mixtures thereof.

22. The process of claim 20, and further including the step of selecting the perfluorinated inorganic gas compound from a group consisting of $NF_3$, $SF_6$, $SF_4$, $SiF_4$, $BF_3$ and mixtures thereof.

23. The process of claim 20, and further including the step of establishing the molar ratio of fluorine to hydrogen in the gas within the range between 3:1 and 25:1.

24. The process of claim 23, and further including the steps of:
selecting the perfluorinated inorganic gas compound to be $NF_3$; and
selecting the molar ratio of fluorine to hydrogen in the gas to be in the range of 5:1 to 25:1.

25. The process of claim 24, wherein said molar ratio of fluorine to hydrogen is about 10:1.

26. The process of claim 20, wherein said step of exposing the structure is performed in a chamber in which the pressure is maintained in the range from about 0.01 to about 10 torr, the plasma generated by a RF power source generating about 0.1 to 10 watts/cm$^2$ of structure area.

* * * * *